(12) United States Patent
Evers et al.

(10) Patent No.: US 9,134,390 B2
(45) Date of Patent: Sep. 15, 2015

(54) MAGNETIC RESONANCE LOCAL COIL

(75) Inventors: Daniel Evers, Otterfing (DE); Klaus Huber, Effeltrich (DE); Florian Poprawa, München (DE); Christina Schindler, Rohrdorf-Lauterbach (DE); Markus Vester, Nürnberg (DE); Jörg Zapf, München (DE)

(73) Assignee: Siemens Aktiengesellschaft, München (DE)

( * ) Notice: Subject to any disclaimer, the term of this patent is extended or adjusted under 35 U.S.C. 154(b) by 582 days.

(21) Appl. No.: 13/436,576

(22) Filed: Mar. 30, 2012

(65) Prior Publication Data
US 2012/0249148 A1 Oct. 4, 2012

(30) Foreign Application Priority Data
Mar. 31, 2011 (DE) .......... 10 2011 006 493

(51) Int. Cl.
*G01V 3/00* (2006.01)
*G01R 33/422* (2006.01)
*G01R 33/3415* (2006.01)
*G01R 33/36* (2006.01)

(52) U.S. Cl.
CPC .......... *G01R 33/422* (2013.01); *G01R 33/3415* (2013.01); *G01R 33/3621* (2013.01); *G01R 33/3692* (2013.01)

(58) Field of Classification Search
CPC ...................................... G01R 33/42

USPC .................................... 324/318, 322
See application file for complete search history.

(56) References Cited

U.S. PATENT DOCUMENTS

| 5,296,813 | A | 3/1994 | Holmes et al. |
| 7,403,011 | B2 * | 7/2008 | Burdick et al. ............... 324/318 |
| 2007/0188175 | A1 | 8/2007 | Burdick, Jr. et al. |
| 2013/0278268 | A1 * | 10/2013 | Martius et al. ................ 324/322 |

FOREIGN PATENT DOCUMENTS

EP 2 175 289 A1 4/2010

OTHER PUBLICATIONS

German Office Action dated Nov. 11, 2011 for corresponding German Patent Application No. DE 10 2011 006 493.1 with English translation.

* cited by examiner

*Primary Examiner* — Louis Arana
(74) *Attorney, Agent, or Firm* — Lempia Summerfield Katz LLC (57) ABSTRACT

The present embodiments relate to a magnetic resonance local coil with a receive antenna for receiving magnetic resonance signals. The magnetic resonance local coil also includes a transmission unit for transmitting magnetic resonance signal data generated on the basis of the magnetic resonance signals via a data transmit antenna of the magnetic resonance local coil to a signal data receiving unit of a magnetic resonance tomography systems. The transmission unit is provided, at least in sections, with screening with a first metal coating and a first dielectric coating.

21 Claims, 6 Drawing Sheets

MAGNETIC RESONANCE LOCAL COIL

This application claims the benefit of DE 10 2011 006 493.1, filed on Mar. 31, 2011.

BACKGROUND

The present embodiments relate to a magnetic resonance local coil.

In a magnetic resonance tomography system, conventionally the body to be examined is exposed, with the aid of a basic magnetic field system, to a relatively high basic magnetic field of 3 or 7 tesla, for example. A magnetic field gradient is also applied with the aid of a gradient system. High-frequency excitation signals (HF signals) are then emitted by way of a high-frequency transmission system using suitable antenna devices in order to tip the nuclear spin of atoms that have been excited in a resonant manner by the high frequency field. The nuclear spin of the atoms is tipped by a defined flip angle in relation to the magnetic field lines of the basic magnetic field. This high-frequency excitation or the resulting flip angle distribution is also referred to below as nuclear magnetization or "magnetization." During relaxation of the nuclear spin, high-frequency signals (e.g., magnetic resonance response signals ("magnetic resonance signals" for short)) are emitted and received by suitable receive antennas and further processed. The raw data acquired in this way may be used to reconstruct the desired image data.

The emission of the high-frequency signals for nuclear spin magnetization may be performed by a "whole-body coil" or "body coil." A typical design of this coil is a cage-like antenna (e.g., a birdcage antenna) including a plurality of transmit rods arranged running parallel to the longitudinal axis around a patient chamber of the tomography system, in which a patient is present during the examination. At an end face, the antenna rods are respectively connected to each other in a capacitive manner in a ring shape.

Local coils may be used to receive the magnetic resonance response signals from the object under examination. The local coils are receive antenna assemblies including at least one receive antenna element (e.g., in the form of conductor loops). During the examination, the local coils are arranged relatively close to the body surface and if possible, directly on the organ or body part of the patient to be examined. The receive antenna elements may be embodied as a coil. Unlike larger antennas arranged at a greater distance from the patient, local coils have the advantage of being arranged closer to the areas of interest. This reduces the noise component resulting from the electrical losses within the patient's body, which has the result that the signal-noise ratio of the local coil may be better than that of the more remote antenna.

The magnetic resonance signals received by the receive antenna elements may be pre-amplified in the local coil and conducted out of the central region of the magnetic resonance system via cables and sent to a screened receiver in an MRI signal processing device. The received data are digitized and further processed for the imaging.

The cabling of the local coils is, for example, not desired, since the cables cannot be simply run from the patient table to the evaluation device. The cables are perceived as disruptive by the staff, and the patient table with the patient and local coil mat is moved, the cables thus being guided loosely. Therefore, the handling of local coils may be simplified if the data transmission from the local coils to the magnetic resonance tomography system is wireless. It is advantageous, even at the local coil, for the magnetic resonance signals to be provided in analog form and digitized prior to the wireless transmission. Since a circuit of this kind occurs in the "field of view" of the magnetic resonance tomography system (e.g., in the measuring field), the circuit is screened. For example, digital circuits may be susceptible to interfering radiation and may even themselves cause interfering emissions. The function of the circuits may be impaired by the strong field of the high-frequency transmitter for the transmission of the excitation signals. High-frequency emissions emitted by the circuit may be received by the adjacent high-sensitivity receive antenna elements of the local coils and interfere with the reception of the magnetic resonance signals. In addition to improving the electrical properties, the screening may also provide mechanical protection for the circuit.

As standard, digital circuits are screened (e.g., shielded) with an electrically conductive cover connected to a grounding surface. However, in a magnetic resonance device, a particular problem is created by the necessary compatibility between the screening and the alternating fields used. For example, the low-frequency gradient fields that may occur with frequencies of up to 100 kHz may induce unwanted eddy currents in the screening. These eddy currents cause secondary magnetic fields, severe heating due to ohmic losses and vibrations due to Lorentz forces. Shadowing or displacement of the high-frequency fields used during transmission and reception (e.g., the excitation signals and the magnetic resonance signals) may be kept low. The screening may be configured such that these high-frequency fields are not distorted such that the field strength drops in sections.

SUMMARY AND DESCRIPTION

The present embodiments may obviate one or more of the drawbacks or limitations in the related art. For example, a magnetic resonance local coil with improved ease-of-handling that may be used without difficulty in the measuring field of a magnetic resonance tomography system is provided.

A magnetic resonance local coil according to the present embodiments may include one or more receive antennas to receive the magnetic resonance signals.

In addition, the magnetic resonance local coil includes a transmission unit in order to transmit magnetic resonance signal data generated on the basis of received magnetic resonance signals via a data transmission channel to a signal data receiving unit of a magnetic resonance tomography system. "Transmission unit" may be a circuit arrangement connected to a receive antenna and a data transmit antenna. The transmission unit may convert the magnetic resonance signals into transmittable magnetic resonance signal data or prepare the data to be transmitted in a suitable way for transmission to the signal data receiving unit. The magnetic resonance signal data are also physical high-frequency signals. The term "magnetic resonance signal data" may nevertheless be used in order to differentiate the signals prepared for transmission from the original magnetic resonance signals. The prepared signals may be digital data.

The transmission unit may, for example, include a digital-analog converter to digitize the magnetic resonance signals. The transmission unit may include a modulator in order to prepare the magnetic resonance signal data such that the transmission frequencies for transmission to the signal data receiving unit of the magnetic resonance tomography system lie outside the frequency ranges used for the raw data acquisition for the imaging or other working frequency ranges such as, for example, the low-frequency gradient fields of the magnetic resonance tomography system. This provides that the magnetic resonance tomography system does not suffer interference from the transmission of magnetic resonance signal data via the data transmission channel.

The transmission of the magnetic resonance signal data from the magnetic resonance local coil to the signal data receiving unit may, as described above, be performed wirelessly. The magnetic resonance local coil includes, as part of the data transmission channel, at least one data transmit antenna, via which the magnetic resonance signal data are emitted. The transmission may also take place via optical waveguides, since, unlike electrical connecting cables, optical waveguides may be designed as relatively thin and flexible and hence also offer an advantage over conventional technology. Optical transmission with significantly higher carrier frequencies is also possible so that the bandwidth is greater, and the number of cables may be lower with the same transmission rate. Therefore, a data transmission channel encompasses a suitable interface for the connection of an optical waveguide. However, unless stated otherwise and without restricting the invention hereto, in the following, it will be assumed that the magnetic resonance signal data are transmitted wirelessly.

Between the receive antenna and the transmission unit or as an input stage of the transmission unit, the local coil may include a preprocessing unit. This preprocessing unit may be used to prepare the often very weak analog magnetic resonance signals received by the receive antenna for further processing and optional digitization. This may be amplification of the measured magnetic resonance signals, filtering or another data processing operation such as mixing with another frequency or modulation.

According to the present embodiments, the transmission unit is provided at least in sections with screening with a first metal coating and a first dielectric coating. The first dielectric coating is advantageously disposed between the first metal coating and the transmission unit or components or assemblies of the transmission unit so that the first dielectric coating effects electric insulation of components of the transmission unit and the electrically conductive metal coating. This at least two-coating design with a dielectric coating in addition to the metal coating makes it possible to embody the metal coating, which exerts the actual electrically screening function, such that the problems with the screening described in the introduction (e.g., the induction of eddy currents by the gradient fields or the shadowing of the high-frequency signals required for the imaging) may be minimized, and the screening functions effectively (e.g., so that the functioning of the transmission unit is not impaired by the fields of the magnetic resonance tomography system, and electromagnetic emissions from the transmission unit do not impair the functioning of the magnetic resonance tomography system). For example, the metal coating may be very thin, which impedes eddy currents. Other advantageous designs are also explained below. In addition, the dielectric coating achieves the desired increased mechanical stability and, at the same time, the components are better protected against environmental influences such as, for example, condensation. Consequently, this increases the protection for the circuit overall and reduces the failure risk.

Since the local coils are disposed in a strong basic magnetic field of the magnetic resonance tomography system (e.g., as homogeneous as possible), the metal coating is advantageously made of a non-magnetic material. This may be a material with a low relative permeability $\mu_r$ (e.g., in the range of 1). Examples of suitable non-magnetic materials are copper, tin, aluminum and silver. Suitable alloys (e.g., be ironless) may also be used.

The present embodiments also include a magnetic resonance tomography system with at least one magnetic resonance local coil.

With a method according to the present embodiments for producing a magnetic resonance local coil of this kind, the magnetic resonance local coil may, for example, be designed in a conventional way in that the magnetic resonance local coil is equipped with one or more receive antennas, a transmission unit and at least one data transmit antenna. According to the present embodiments, the transmission unit is provided with screening by the application, at least in sections, of a dielectric coating and the application thereover, at least in sections, of a metal coating.

The claims in one claim category may be further developed in analogy to the dependent claims in another claim category.

The screening is designed such that the screening screens the transmission unit as a whole or at least parts of the transmission unit (e.g., at least those parts of the transmission unit, in which digitization of the signals and further digital processing takes place).

The screening may be embodied as an enclosure correspondingly enclosing the transmission unit as a whole or at least parts of the transmission unit. The enclosure may consist wholly or partially of the first metal coating with the associated dielectric coating. For example, the components to be screened may be surrounded substantially completely by the dielectric coating and a metal coating disposed there over.

In one embodiment, the screening includes or forms an elongated screening enclosure (e.g., with a length-width ratio of greater than or equal to 5). In one embodiment, the screening enclosure includes an enclosed first end face and a second end face lying opposite the first end face including at least one opening for connection to the receive antenna. A further opening on the second end face may be used for connection with the data transmit antenna. With this embodiment, therefore, all the signals are introduced and removed at an open end face, and the most interference-intensive circuitry parts such as, for example, an analog/digital converter may be arranged close to the closed end face in the screening enclosure. The dimensions of the screening enclosure are selected so that the diameter of the end faces is smaller than the length of the screening enclosure. With respect to an outside dimensions, the screening enclosure may be embodied with a rectangular cross section extending transverse to the longitudinal axis, a round cross section or an elliptical cross section. In the case of a round cross section, the screening enclosure has a cylindrical shape and hence has the external shape of a "tablet tube." The radius may be substantially smaller than the longitudinal extension of the enclosure.

An elongated slim shape of the screening enclosure of this kind minimizes the repercussion on the magnetic fields of the magnetic resonance tomography system, since the eddy current density induced in a surface substantially scales with the length of the shorter axis of a surface disposed in the magnetic field. A narrow rod such as, for example, a cylindrical tablet tube is heated up less by the penetrating magnetic fields and circumcirculated more gently by high-frequency fields than a wide, cuboidal screening enclosure.

The screening may be embodied such that components (e.g., optionally, also whole assemblies or functional groups) of the transmission unit are screened from each other by the screening. This is possible if, for example, the metal coating of the screening is in contact with a ground of the circuit at selected points.

In one embodiment, the screening enclosure is embodied such that an interior compartment of the screening enclosure surrounded by screening forms an attenuating waveguide.

The attenuating waveguide has a cut-off frequency lying in a prespecified frequency spacing under a transmit frequency for transmitting the magnetic resonance signal data. The transmit frequencies may be in a frequency range above 1 GHz. Depending upon the enclosure design, the attenuating waveguide may, for example, be embodied as a rectangular waveguide, round waveguide or as a waveguide with an elliptical cross section. The embodiment as an attenuating waveguide enables intermediate walls or screenings between different circuitry parts that would otherwise be omitted or embodied more simply.

In one embodiment, the cut-off frequency is selected such that the value of the cut-off frequency is 10% below the value of the transmit frequency. If, for example, the value of the transmit frequency is 20 GHz, a cut-off frequency of 18 GHz is selected. The result is that electromagnetic waves with a frequency below 18 GHz in the interior of the screening enclosure may propagate poorly and are greatly attenuated.

In the interior of the screening enclosure, connecting lines connect the individual components of the transmission unit in an electrically conductive manner. Connecting lines of this kind may function as signal bridges and hence reduce the attenuating effect of the attenuating waveguides. Connecting lines of this kind are connected in the interior of the screening enclosure to suitable low-pass filters, and/or band-stop filters and/or high-pass filters. The insertion of filters of this kind or the blocking measures may, for example, suppress the propagation of interference on the magnetic resonance receive frequency (e.g., of about 64 MHz with a 1.5 T magnetic resonance device or about 123 MHz with a 3 T magnetic resonance device). Correspondingly, the filters may be embodied to precisely block these frequencies.

In one embodiment, the magnetic resonance signal received by the receive antenna is initially converted outside the screened area from the magnetic resonance frequency to an intermediate frequency. The signal input line may also be provided with blocking filters for the magnetic resonance frequency on entry into the screened region. If, in addition, the digital output signals are modulated to a very remote frequency (e.g., to a transmit frequency above 1 GHz) or exported via optical waveguides, all the incoming and outgoing lines may be blocked for the magnetic resonance frequency.

In one embodiment, the screening is embodied as multilayer screening (e.g., the screening includes at least one further metal coating and at least one further dielectric coating). In each case, a further dielectric coating is disposed between two metal coatings to insulate the two metal coatings from each other. A more conductive screening of this kind results in particularly low interference emissions. In addition, the design with a plurality of different layers achieves even further increased mechanical stability so that the local coil withstands shock tests well. Coating packets, each including one dielectric coating and one metal coating, may additionally be added in order to further improve the screening.

The design of the multilayer (including at least one dielectric coating and one metal coating) screening may take different forms. Part of the screening may also be formed by a printed circuit board with a dielectric substrate that bears the conductor structure of the circuit arrangement and the components on one side and which is coated on the other side with a metal coating functioning as screening.

In order to achieve effective screening, the metal coating(s) of the screening may be electrically connected to a specific screening potential (e.g., the zero potential such as the ground of the actual circuit). If the circuit arrangement of the transmission unit is, for example, arranged on a printed circuit board, contact between the metal coating(s) and a ground surface of the printed circuit board may, for example, be established.

The application of the dielectric coating onto the transmission unit or the components thereof may, for example, take place by potting with a suitable dielectric potting compound (e.g., an epoxy-containing potting compound). An injection-molding process, for example, may be used. Alternatively, a dielectric coating may be applied by laminating-on an insulating film. In one embodiment, a polyimide film may be used for this. The lamination may, for example, be performed by film deep-drawing. In both cases, the dielectric coating may have an insulation thickness of 50 to 500 μm.

Both potting and film lamination permit a very flat design that facilitates a high integration density. Both variants also facilitate the direct reproduction of the superficial topography that may, for example, be determined by the components on a printed circuit board. In the case of potting, for example, a planar surface that may be further built upon may be provided.

For example, with potting any shape of screening enclosure desired may be achieved (e.g., the above-described oblong enclosure shape such as an elongated cylindrical shape). For example, a printed circuit board bearing the components of the transmission unit (e.g., already with an elongated slender shape) may be cast all round in the desired shape.

In another act, the metal coating is applied. The application of the metal coating may take place by various suitable technologies.

For example, a metal coating may be applied in that a metal-clad film is laminated-on. For example, a metal coating with a thickness of 100 nm to 5 μm may be created. In an alternative process, the application of a thin metal coating of this type is performed, for example, by vapor-deposition.

The metal coating may be reinforced in a second act, for example, by galvanic deposition. This enables the metal coating to be brought to a coating thickness of 5 to 50 μm. Even if the metal coating includes a plurality of thin layers, a reinforced metal coating of this kind is considered to be a single metal coating since the metal layers are not separated as individual coatings by a dielectric.

In one embodiment, the thickness of the metal coatings is selected such that the thickness at least corresponds to the skin depth of the electromagnetic waves to be screened. The skin depth δ is obtained according to the following $$\delta = \frac{1}{\sqrt{\pi f \mu_0 \mu_r \sigma}} \qquad (1)$$

In equation (1), f is the frequency of the electromagnetic waves to be screened, $\mu_o$ is the permeability constant of the vacuum, $\mu_r$ for the relative permeability of the material of the metal coating, and σ is the electric conductivity of the metal of the metal coating. With copper as a material, for a frequency of 1 MHz, a skin depth of 66 μm is obtained, and for a frequency of 100 GHZ, 200 nm is obtained.

When the screening is configured with two or more metal coatings for the screening of electromagnetic waves of different frequencies, the two or more metal coatings may have different thicknesses; the thickness of the individual metal coatings may vary according to the frequency band to be screened.

A dielectric coating may be embodied free of structures or, as mentioned above, emulate the topography formed by the components of the transmission unit. In one embodiment, the dielectric coating is provided with structures (e.g., textures). The structures may be μ-structures (e.g., structures in the μm range). A structure or texture of this kind improves the scatter of electromagnetic waves through the dielectric coating in question and hence the screening effect. In one embodiment, the structures have a structure size of from 1 to 500 μm (e.g., up to 200 μm).

The structures may be embodied without any preferred direction and, in this case, effect a scatter of electromagnetic waves with no preferred direction. The structures may have periodic structures with respect to an elongation direction and hence improve the scatter in a selected preferred direction. The structure may, for example, have a saw-tooth shape in the elongation direction. In the case of the screening embodied as an elongated screening enclosure, this elongation direction may be the direction of the longitudinal extension of the screening enclosure.

In the case of a design with a plurality of dielectric coatings, this may also be differently structured or non-structured.

A metal coating may be created over a large area without any structuring. In one embodiment, at least one metal coating is provided with structures. Structuring a metal coating is also able to achieve the suppression of eddy currents in the metal coating. The structures of the metal coatings may be μ-structures, where the structures may have a structure size of from 1 μm to 5000 p.m.

The structures of the metal coatings may also have any shape (e.g., be embodied as regular or irregular). The structures may form periodic grid structures in an elongation direction. The eddy-current-damping effect of the structures may be particularly optimized in a preferred direction.

In the case of a configuration with a plurality of metal coatings, the plurality of metal coatings may also be structured differently or non-structured.

In one embodiment, at least one metal coating is embodied as the data transmit antenna. This results in a particularly simple design. The magnetic resonance local coil may, for example, include two metal coatings, of which one metal coating is connected for grounding to the ground of the printed circuit board forming the transmission unit. The second metal coating is at least temporarily embodied as separable from the ground layer and so, may be used as a data transmit antenna during operation.

In one embodiment, passivation is applied to a metal coating. The passivation provides corrosion protection for the screening. The passivation may, for example, take place by the galvanic deposition of tin. The passivation may, for example, have a layer thickness of from 1 to 5 μm.

DETAILED DESCRIPTION OF THE DRAWINGS

Figure 1:
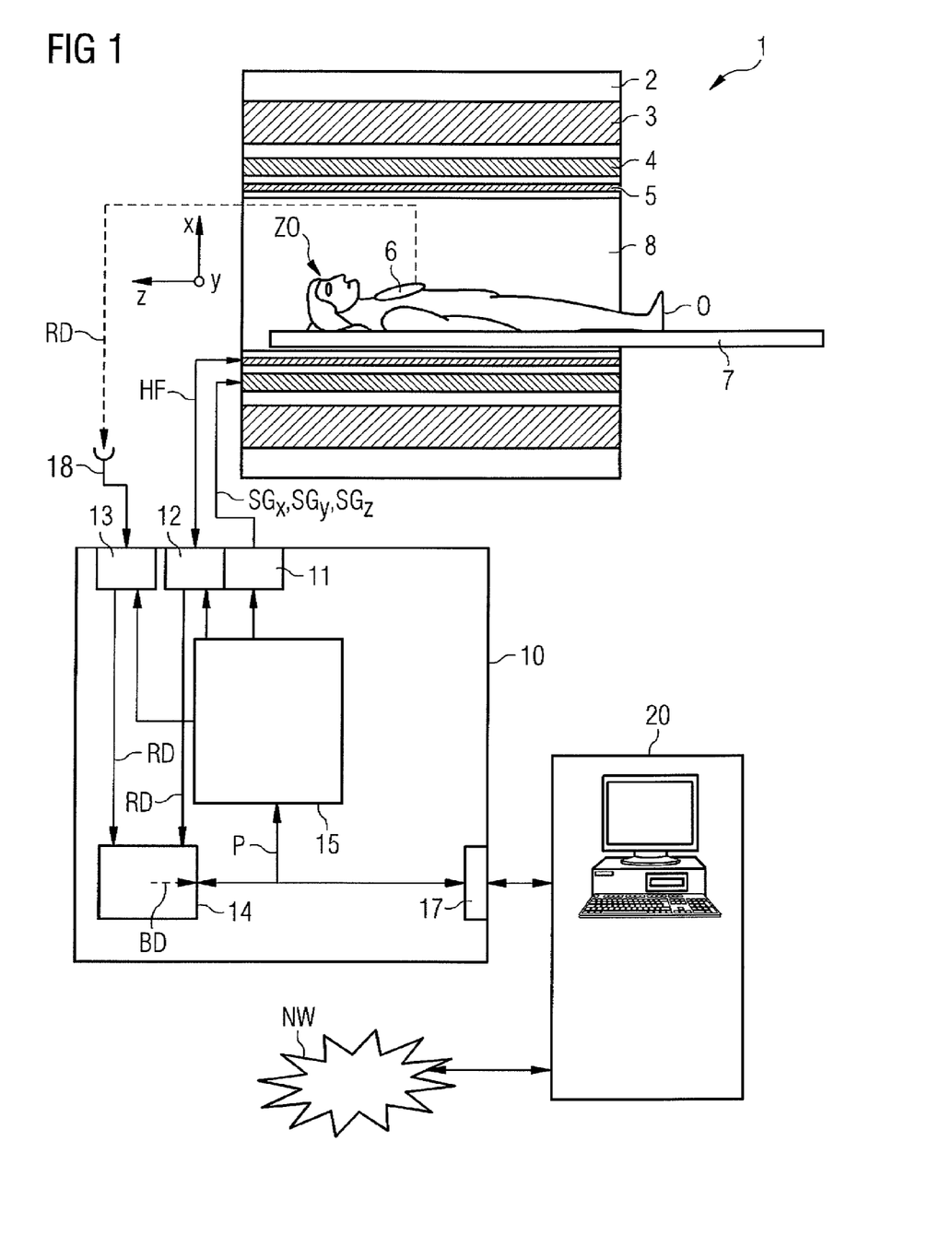
FIG. 1 is a schematic diagram of an exemplary embodiment of a magnetic resonance tomography system.

FIG. 1 is a schematic diagram of a magnetic resonance tomography system 1. The magnetic resonance tomography system 1 includes a magnetic resonance tomography scanner 2 with an examination chamber 8 or patient tunnel disposed therein. A patient bed 7 may be introduced into this patient tunnel 8 so that, during an examination, a patient O or test subject lying on the patient bed 7 may be positioned at a specific position inside the magnetic resonance tomography scanners 2 relative to the magnetic system and high-frequency system arranged therein. Alternately, the patient bed 7 may also be moved between different positions during a measurement.

Components of the magnetic resonance tomography scanners 2 are a basic field magnet 3, a gradient system 4 with magnetic field gradient coils in order to apply optional magnetic field gradients in the x-, y- and z-directions, and a whole-body high-frequency coil 5 (or body coil).

The magnetic resonance tomography system 1 also includes a control device 10 and a terminal 20. The control device 10 is connected via a terminal interface 17 to the terminal 20 so that an operator may control the entire magnetic resonance tomography system 1 via the terminal 20. In one embodiment, the terminal 20 is a computer with a keyboard, one or more screens and further input devices such as, for example, a mouse or similar so that a graphical user interface is available to the operator.

The control device 10 includes, for example, a gradient control unit 11 that may include a plurality of subcomponents. This gradient control unit 11 connects the individual gradient coils with gradient control signals $SG_x$, $SG_y$, $SG_z$. The gradient control signals $SG_x$, $SG_y$, $SG_z$ are gradient pulses that may be set during a measurement to precisely stipulated temporal positions and with a precisely specified temporal course. The control device 10 also includes a high-frequency transmit/receive unit 12 in order to feed high-frequency pulses HF into the body coil as MR excitation signals. The reception of magnetic resonance signals induced in the patient O may, for example, also take place via the whole-body coil-high-frequency coil 5 and the high-frequency transmit/receive unit 12.

The magnetic resonance signals are received by at least one local coil 6 disposed close to the patient O. The local coil 6 is configured to convert the received magnetic resonance signals (the actual raw data) into magnetic resonance signal data RD (e.g., in raw data in digitized form prepared for wireless transmission) and to transmit the magnetic resonance signal data RD wirelessly to further components of the magnetic resonance tomography system 1 via a data transmit antenna (not shown in FIG. 1). One embodiment of a local coil of this kind is explained below with reference to FIG. 2.

The control device 10 includes a signal data receiving unit 13 with a signal data antenna 18. The signal data receiving unit 13 uses the signal data antenna 18 to receive the magnetic resonance signal data RD sent by the data transmit antenna of the local coil 6. The received magnetic resonance signal data RD, which are optionally appropriately processed in the signal data receiving unit 13 (e.g., demodulated and/or decoded), are sent to a reconstruction unit 14 that constructs image data BD therefrom in the usual way. The reconstruction unit 14 stores the image data BD at a memory (not shown) and/or sends the image data BD via the interface 17 to the terminal 20 so that the operator may see the image data BD. The image data BD may also be stored and/or displayed and evaluated at other places via a network NW.

The gradient control unit 11, the HF transmit/receive unit 12 and the receive unit 13 for the local coils 6 are each controlled in coordination by a measuring control unit 15. This uses suitable commands to provide that a desired gradient pulse is transmitted by suitable gradient control signals $SG_x$, $SG_y$, $SG_z$ and in parallel, controls the HF transmit/receive unit 12, such that an HF pulse or a whole HF pulse train is transmitted. The magnetic resonance signals at the local coils 6 may be read and further processed by the HF receive unit 13, and/or any signals at the whole-body coil 5 may be read and further processed by the HF transmit/receive unit 12 at the correct time. The measuring control unit 15 may specify the corresponding signals for the other components of the control device 10 according to a prespecified control protocol P. The control protocol P stores the control data that is to be set during a measurement.

In one embodiment, a plurality of control protocols P for different measurements is stored in a memory (not shown). This may be selected by the operator via the terminal 20 and optionally varied in order to have a suitable control protocol P available for the currently desired measurement, with which the measuring control unit 15 may work. Alternatively, the operator may also call up control protocols P via a network NW (e.g., from a manufacturer of the magnetic resonance tomography system 1), then optionally modify and use the control protocols P.

The basic course of a magnetic resonance tomography measurement of this kind and the named components of a magnetic resonance tomography systems are known to the person skilled in the art and so will be not be discussed in any further detail here. Otherwise, a magnetic resonance tomography scanner 2 of this kind and the associated control device 10 may also include a plurality of further components that also will not be explained in detail here. The magnetic resonance tomography scanner 2 may also have a different structure (e.g., with a patient chamber open at the side).

Figure 2:
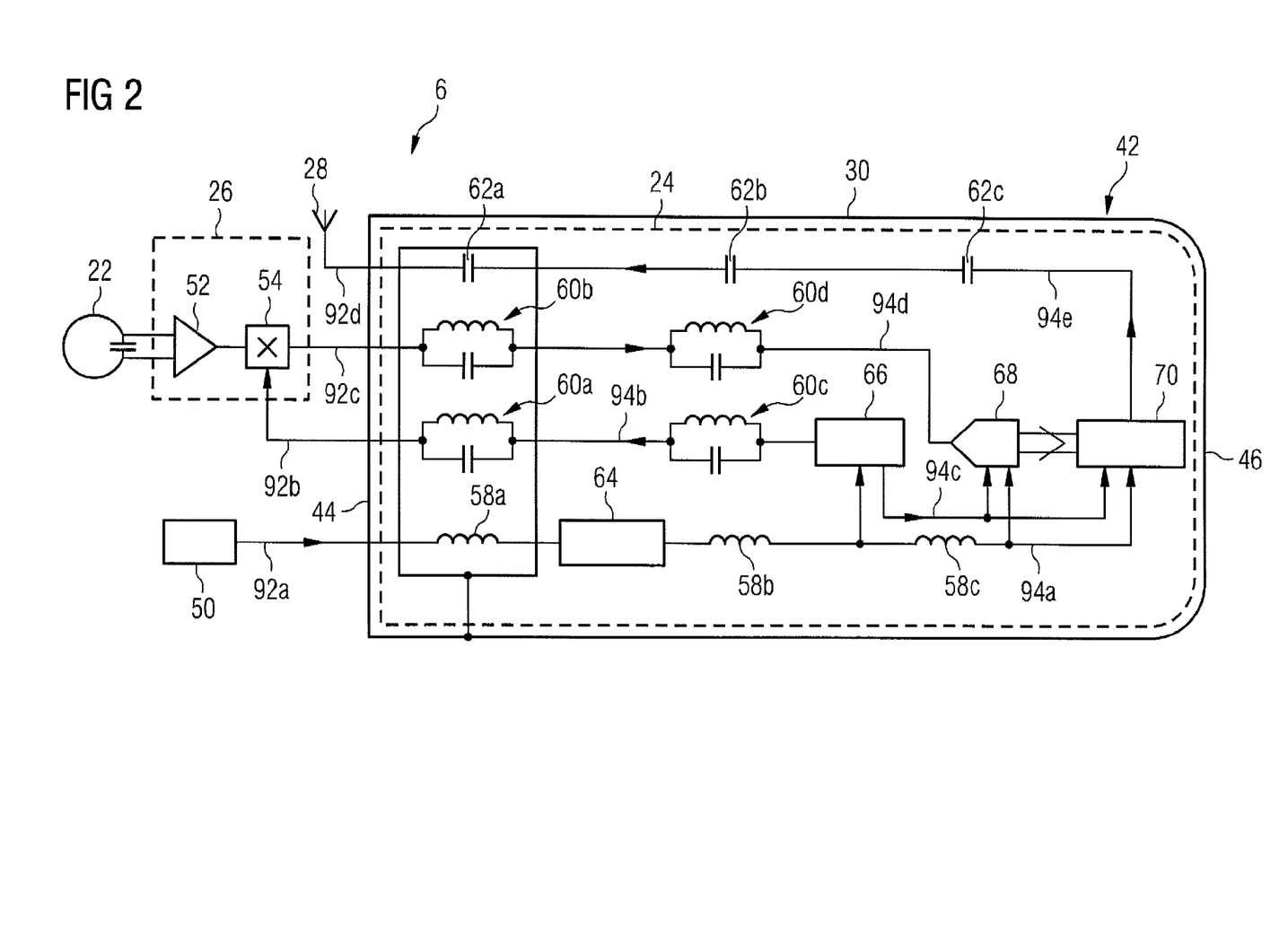
FIG. 2 is a schematic diagram of an exemplary embodiment of a local coil.

The following explains the design of one embodiment of the magnetic resonance local coil 6 with reference to FIG. 2.

The magnetic resonance local coil 6 includes a receive antenna 22 for receiving magnetic resonance signals, a preprocessing unit 26 for preprocessing the magnetic resonance signals, a transmission unit 24 for converting the magnetic resonance signals into magnetic resonance signal data RD, and an energy source 50 for supplying the transmission unit 24 and the further components of the local coil 6 with energy. The magnetic resonance local coil 6 also includes a data transmit antenna 28 for wireless transmission of the magnetic resonance signal data RD to the signal data antenna 18 of the control device 10 (see FIG. 1).

The preprocessing unit 26 includes a preamplifier 52 that initially amplifies the magnetic (e.g., very weak) resonance signals received by the receive antenna 22. The magnetic resonance signals amplified by the preamplifier 52 are fed to a mixer 54 that effects a frequency conversion of the magnetic resonance signals so that the signals leaving the mixer 54 lie within a frequency range, in which the magnetic resonance signals do not interfere with the magnetic resonance tomography measurement and other components of the magnetic resonance tomography system 1.

The transmission unit 24 is accommodated in a screening enclosure 42 structured according to the present embodiments. The screening enclosure 42 has a substantially cylindrical shape with a first end face 46 and a second end face 44. The cylindrical screening enclosure has, for example, a length of 10 cm and a diameter of 5 cm. The first end face 46 of the cylindrical screening enclosure 42 is enclosed, while the second end face 44 of the cylindrical screening enclosure 42 has openings, through which connecting leads 92a to 92d extend from the transmission unit 24 to the preprocessing unit 26, the energy source 50 and the data transmit antenna 28.

On an inlet side, the transmission unit 24 includes a filter unit 56, with which interference signals on the connecting leads 92a to 92d are blocked so that the interference signals cannot reach the other components of the transmission unit 24 and interfere with the function of the other components or, vice versa. No interfering signals may escape from the transmission unit 24 to the outside.

This filter unit 56 includes a first low-pass filter 58a that provides that no high-frequency interference signals from the energy source 50 or via the connecting lead 92a may penetrate the transmission unit 24, or no interference signals may leak out. The filter unit 56 includes two band-stop filters 60a, 60b for the connecting leads 92b, 92c to the preprocessing unit 26. A high-pass filter 62a provides that only the desired magnetic resonance signal data modulated to the transmit frequency may reach the data transmit antenna 28 from the transmission unit 24.

In addition to the filter unit 56, the transmission unit 24 includes a power supply 64, a clock generator 66, an analog/digital converter 68 and a modulator 70.

The power supply 64 is connected to the energy source 50 and supplies the clock generator 66, the analog/digital converter 68 and the modulator 70 with electrical energy via a connecting line 94a.

Two low-pass filters 58b, 58c are looped into the connecting line 94a in order to provide that no high-frequency signals, which may become coupled in the connecting lines 94a, exert a negative influence on the function of the clock generator 66, the analog/digital converter 68 or the modulator 70.

An output of the clock generator 66 is connected by a connecting line 94b via a band-stop filter 60c to the band-stop filter 60a of the filter unit 56. From there, the output of the clock generated 66 is connected via the connecting lead 92b to the mixer 54. Thus, a clock pulse for converting the frequency of the magnetic resonance signals amplified by the preamplifier 52 is provided to the desired mixed frequency. The band-stop filter 60c blocks unwanted frequencies that may become coupled into the connecting line 94b. An output of the clock generator 66 is connected via a connecting line 94c to the analog/digital converter 68 and the modulator 70 in order to provide this with the appropriate clock pulse as well.

On the input side, the analog/digital converter 68 is connected by the connecting line 94d via a band-stop filter 60d, the band-stop filter 60b of the filter unit 56, and the connecting lead 92c to the output from the mixer 54. The band-stop filter 60d provides that unwanted frequencies cannot become coupled into the connecting line 94d between the analog/digital converter 68 and the filter unit 56.

The magnetic resonance signal data digitized by the analog/digital converter 68 are fed to the modulator 70. The modulator 70 uses the clock signal of the clock generator 66 to generate digitized magnetic resonance signal data that are fed via the connecting line 94e and via the filter unit 56 and further via the connecting lead 92d into the data transmit antenna 28. In order to be able to exclude any unwanted frequencies, two high-pass filter 62b, 62c are looped into the connecting line 94e.

The digitized magnetic resonance signal data transmitted by the data transmit antenna 28 are, as described above, received and further processed by the antenna 18 of the control device 10 (see FIG. 1).

An explanation of an exemplary design of a screening 30 of the transmission unit 24 according to the present embodiments and an embodiment of a method for production of the screening are described with reference to FIGS. 3 to 8.

Figure 3:
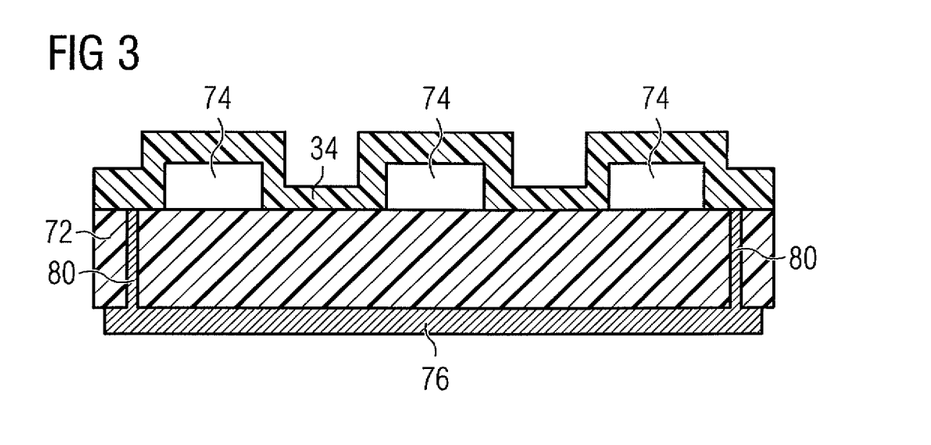
FIG. 3 to FIG. 8 are schematic sectional views to show different acts of one embodiment of a method for producing a screening.
Figure 4:
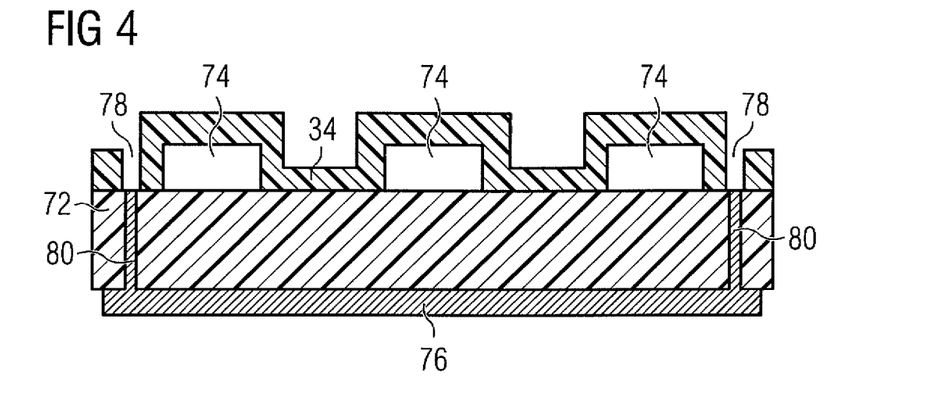
Figure 5:
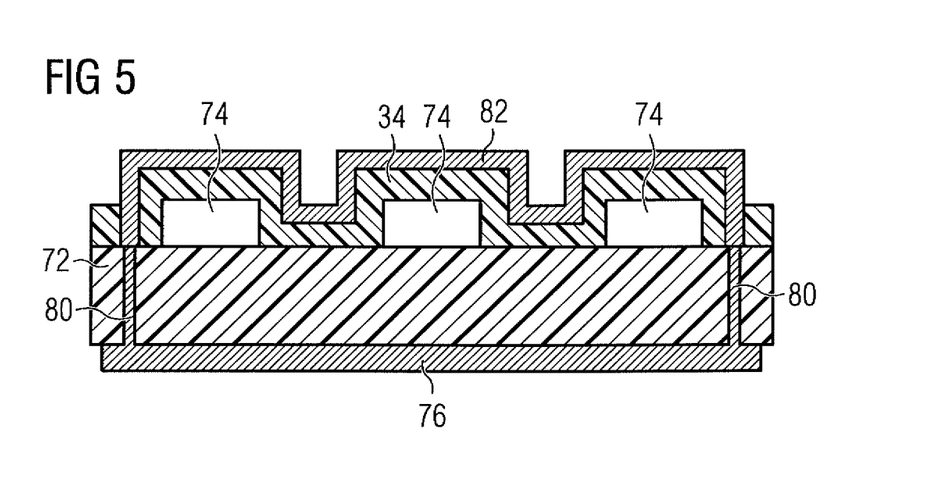

A sectional view of a transmission unit 24 is shown in schematic form in FIG. 3. The transmission unit 24 includes a printed circuit board 72, on which components 74 are arranged. The components, when interconnected, take over, for example, the functions of the power supply 64, the clock generator 66, the analog/digital converter 68, the modulator 70 or other components or functional groups of the transmission unit 24. The components 74 are arranged on an upper side of the printed circuit board 72. A rear side of the printed circuit board 72 is provided with a continuous coating made of an electrically conductive material forming the ground 76 (e.g., the ground potential of the circuit). The printed circuit board 72 includes two contact openings 80 that are filled with electrically conductive material and hence permit contact with the ground 76 from the front side of the printed circuit board 72.

In a first act according to FIG. 3, the printed circuit board 72 provided with the components 74 is coated with a first dielectric coating 34. The dielectric coating 34 may, for example, have a thickness of 50 to 500 micrometers. The coating may, for example, be performed by injection molding, where, for example, an epoxy resin is used. Alternatively, an insulation film (e.g., a polyimide film) may be laminated-on. As a result, the printed circuit board 72 with the components 74 is provided with a first dielectric coating 34 with a substantially constant thickness so that the surface topography that is established by the components 74 is reproduced on the top side.

In a second act (see FIG. 4), two passage openings 78 are introduced into the dielectric coating 34 in a laser beam ablation procedure in order to expose the contact openings 80 in the printed circuit board 72. Alternatively, the passage openings 78 may also be formed in that, prior to the application of the dielectric coating 34, in the first act, a sacrificial coating is applied in the region of the contact openings 80 on the upper side of the printed circuit board 72 and removed after the application and curing of the dielectric coating 34 in order to expose the contact openings 80.

In a third act (see FIG. 5), to form a first metal coating 32, a first very thin metal layer 82 is applied. This first metal layer 82 is, for example, made of copper and is applied by vapor phase deposition. The first metal coating 32 has a thickness of up to 500 nm, for example. The first metal layer 82 has an electric connection with the ground 76 through the contact openings 78 and the passage openings 80.

In a fourth act (see FIG. 6), a second metal layer 84 is applied to the first metal layer 82 by galvanic deposition to complete the first metal coating 32. The second metal layer 84 is, for example, also made of copper so that the two metal coatings 82, 84 form a film 32. For the galvanic deposition of the second metal layer 84, the ground 76 on the rear side of the printed circuit board 72 may be used as an electrical connection. The second metal layer 84 reinforces the thickness of the metal coating 32 to up to 50 μm.

Figure 6:
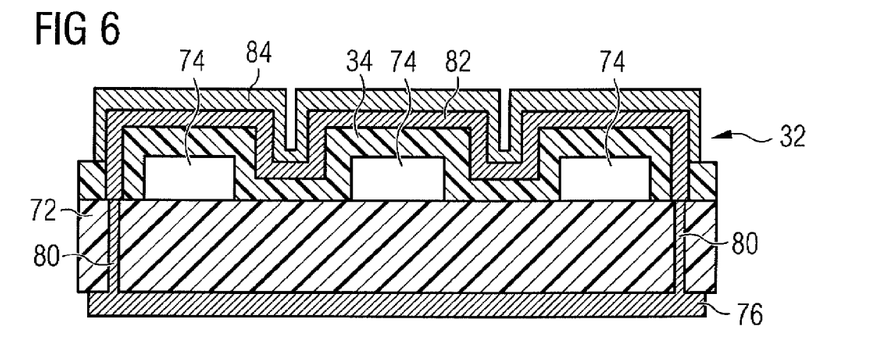

Alternatively, the first metal coating or the first layer of the first metal coating may be applied by laminating-on a metal-clad film. The metal-clad film may be coated with copper.

In a fifth act (FIG. 7), a second dielectric coating 34' is applied to the first metal coating 32. The second dielectric coating 34' may be made of the same material as the first dielectric coating 34 and applied in the same way.

Figure 7:
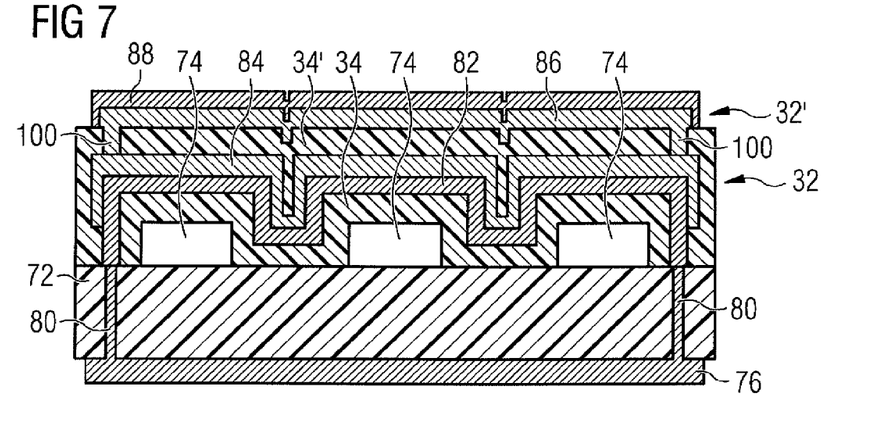
Figure 8:
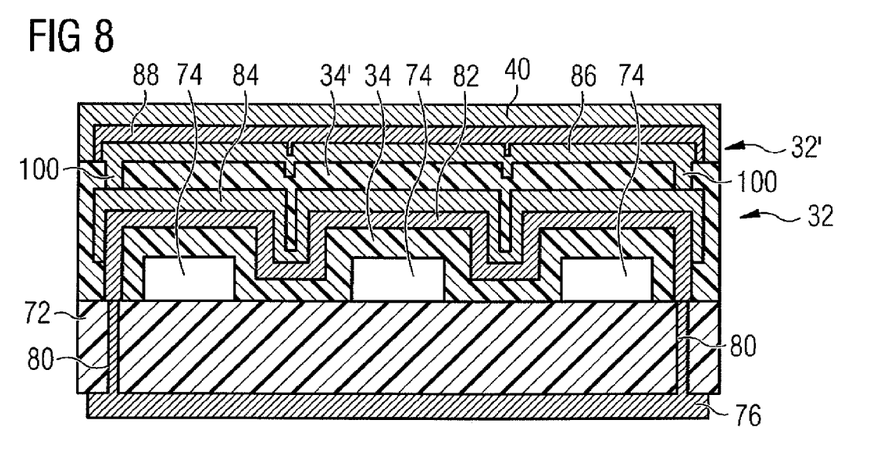

Prior to the application of a second metal coating 32', the second dielectric coating 34' is again provided with contact openings or through-openings 100 extending as far as the first metal coating 32. The same technologies as those in act 2 (see FIG. 4) may be used to introduce the contact openings 78.

The second metal coating 32', which is made up of a first metal layer 86 and a second metal layer 88, is applied to the second dielectric coating 34'. The first metal layer 86 is again applied to the second dielectric coating 34' by vapor phase deposition. The first metal layer of the second metal coating 32' is connected to the first metal coating 32 in an electrically conductive way the through-openings 100 and thus also to the ground 76 on the rear of the printed circuit board 72. To complete the second metal coating 32', a second metal layer 88 is applied to the first metal layer 86 again by galvanic deposition until the second metal coating 32' has the desired thickness of between, for example, 5 and 50 μm. The second metal coating 32' (e.g., the metal coatings 86, 88 thereof) may also be made of copper.

In a sixth act (FIG. 8), passivation 40 is applied to the second metal layer 88 of the second metal coating 32'. The passivation 40 is made of tin, which is deposited galvanically on the second metal layer 88 of the second metal coating 32' until a layer thickness of from 1 to 5 μm is achieved. Alternatively, a non-metallic passivation that is applied, for example, by spraying or immersion may be selected. The passivation 40 provides protection from moisture and mechanical damage.

Figure 9:
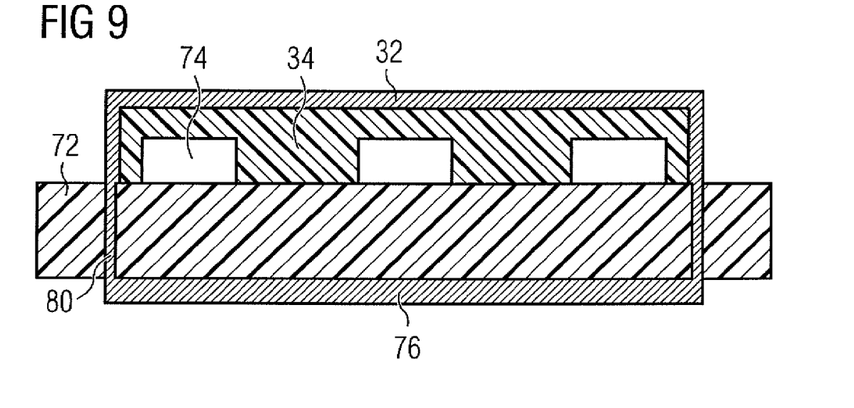
FIG. 9 is a schematic section through a transmission unit with screening according to one embodiment.

FIG. 9 shows a schematic section through a further exemplary embodiment of a transmission unit 24, the components 74 of which are potted in a potting compound to form the dielectric coating 34. The potting creates a planar surface, on which, as described above, a metal coating 32 that is connected in an electrically conductive manner through contact openings 80 to an outside ground surface 76 of a printed circuit board 72, on which the components 74 are arranged, is applied.

Potting with potting compound enables any shape of the screening enclosure 42 to be created. In one embodiment, a substantially cuboidal screening enclosure 42 with a length of, for example, 10 cm, a width of 5 cm and a height of 5 mm may be created.

Alternatively, the potting compound for forming the dielectric coating 34 may be applied such that the potting compound forms a substantially cylindrical screening enclosure 42 (as explained in connection with FIG. 2), in which the printed circuit board 72 with the components 74 is accommodated.

An elongated shape of this kind (e.g., cuboidal or cylindrical) minimizes the repercussion on the magnetic fields oriented in all the spatial directions, since the induced current density in a surface positioned in the magnetic fields is substantially determined by the length of the shortest axis of the shape. A body embodied as a narrow rod is heated to a less degree than a cuboid with a more quadratic cross section.

An elongated shape of this kind enables the screening enclosure 42 to be embodied as an attenuating waveguide with a cut-off frequency of, for example, 10% below the values of the frequency to be screened. In one embodiment, the value of the frequency to be screened is, for example, 20 GHz (e.g., a value of 18 GHz is selected as the cut-off frequency).

In the exemplary embodiment according to FIG. 9, the screening may be made up several coatings. For example, at least one further dielectric coating is applied to the metal coating, and another second metal coating is applied thereover.

Figure 10:
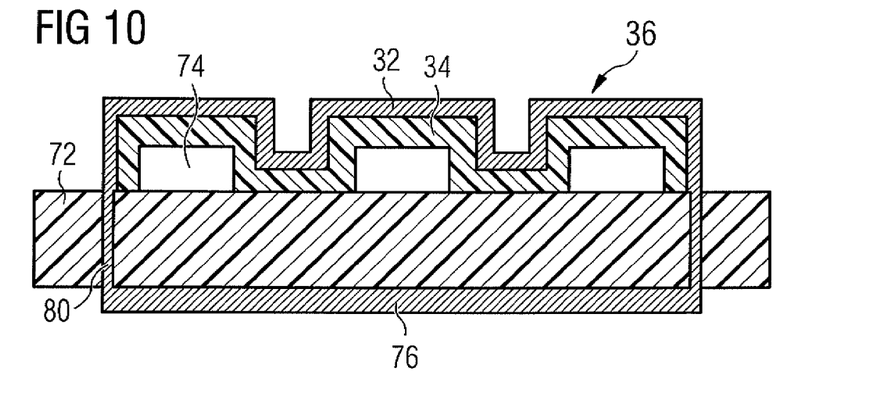
FIG. 10 is a schematic section through a transmission unit with screening according to another embodiment.

FIG. 10 shows a schematic section view of another embodiment of a transmission unit 24 with a very simple screening. The components 74 are coated with a potting compound to form the dielectric coating 34, such that the topography formed by the upper side of the printed circuit board 72 is retained. Correspondingly, the metal coating 32 also has the same topography. A screening 30 with a structure 36 is available. This structure 36 suppresses unwanted eddy currents in the metal coating 32. This design substantially corresponds to the design according to FIG. 8 after the third act according to FIG. 5.

Figure 11:
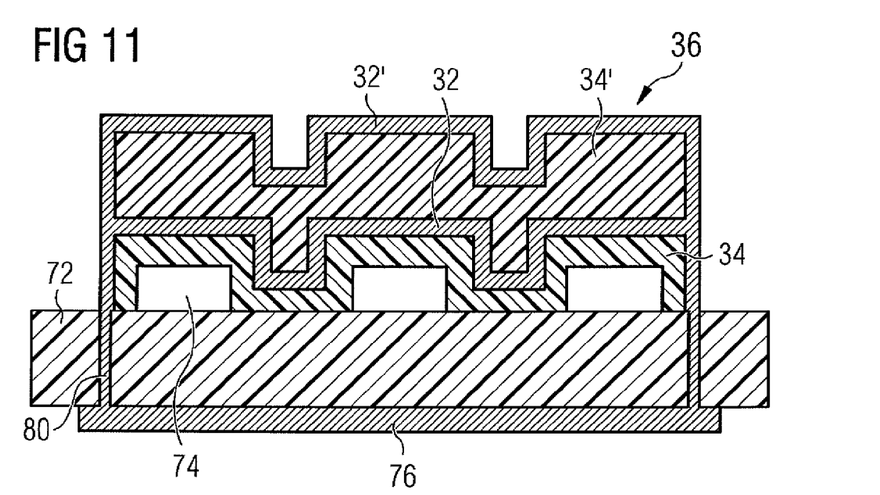
FIG. 11 a schematic section through a transmission unit with one embodiment of screening having two dielectric coatings and two metal coatings.

FIG. 11 shows a schematic section view of a further embodiment of a transmission unit 24 that has been provided with two metal coatings 32, 32' and two dielectric coatings 34, 34'. Both metal coatings 32, 32' are connected through the passage openings 80 to the ground 76 in an electrically conductive manner on the rear of the printed circuit board 72. As in the exemplary embodiment shown in FIG. 10, the topography of the components 74 on the printed circuit board 72 is reproduced in the second metal coating 32' and hence forms a structure 36 that suppresses unwanted eddy currents.

Figure 12:
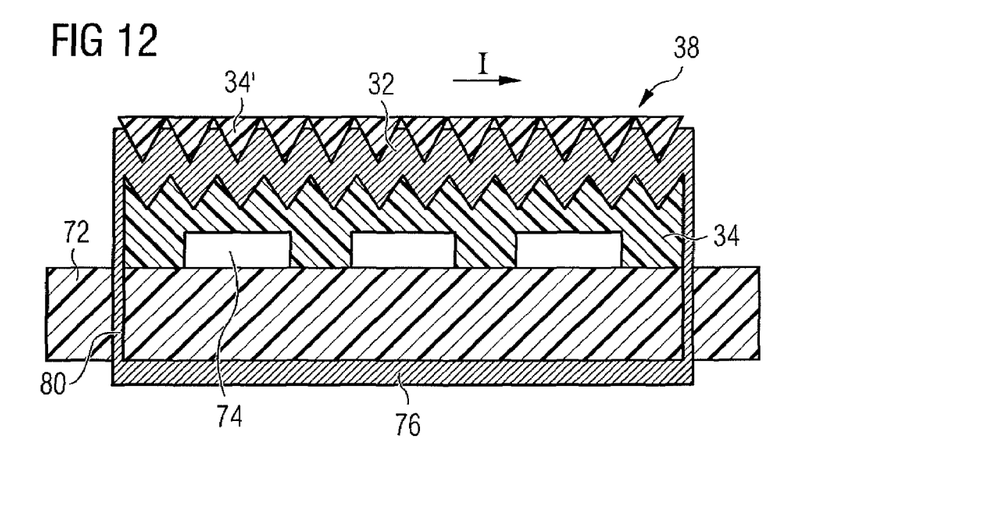
FIG. 12 is a schematic section through a transmission unit with one embodiment of screening with a structured metal coating.

FIG. 12 shows a further exemplary embodiment of a transmission unit 24 in a schematic sectional view. The dielectric coating 34 is provided with a µ-structure 38 (e.g., a texture) that is periodic. The periodicity extends along an elongation direction I. The structure 38 has a saw-tooth shape in the elongation direction I (e.g., the elongation direction does not reproduce the topographies caused by the components 74 on the printed circuit board 72).

A metal coating 32 is applied to the structured dielectric coating 34, in which coating a µ-structure is correspondingly reproduced. The metal coating 32 may, as described above, include a first metal layer and a second metal layer. The first metal layer is applied by vapor phase deposition, and the second metal layer is galvanically deposited. Alternatively, the metallization may also take the form of the application of a film clad with copper.

The structure 38 of the dielectric coating 34 has the effect of improving the scatter of electromagnetic waves. The structural dimensions may be effective if their dimensions are $\lambda/2$ to $\lambda/4$ of the wavelength of the electromagnetic waves to be screened. The structure 36 of the metal coating 32 suppresses unwanted eddy currents. The structures 38 of the dielectric coating 34 have structure sizes of, for example, 1 to 500 µm (e.g., to 200 µm).

To provide that, for the protection of the µ-structure, the screening is given a smooth surface, the metal coating 32 is covered by a second dielectric coating 34' with a smooth outer surface.

Figure 13:
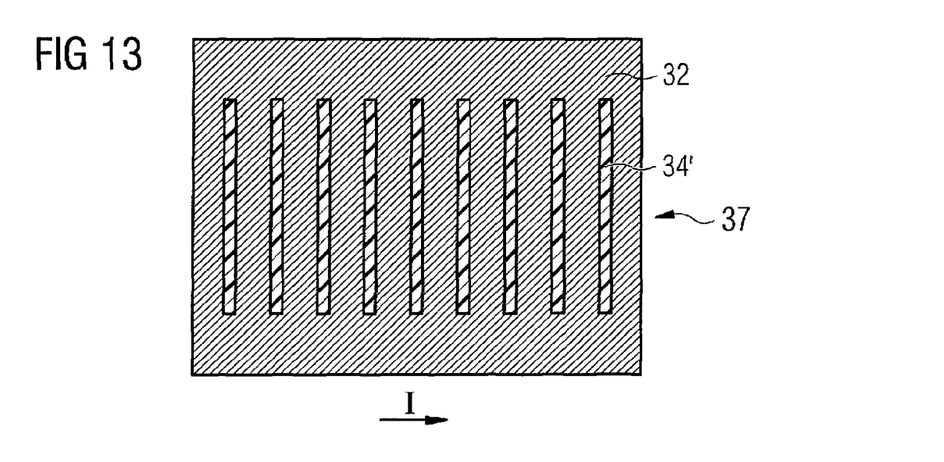
FIG. 13 is top view of one embodiment of a structured metal coating.

FIG. 13 shows a schematic top view of a metal coating 32 that has been provided with a µ-structure 37 with a periodicity also extending in the elongation direction I. To form the structure 37, slot-shaped openings are introduced into the metal layer 32 so that the dielectric coating 34 (in an enlarged view) is visible, and the structures 37 are embodied as periodic grid structures 37 in the elongation direction I. The structures 37 may have structure sizes lying between 1 µm and 5000 µm. Structuring of this kind may effectively prevent or at least damp the propagation of eddy currents.

Figure 14:
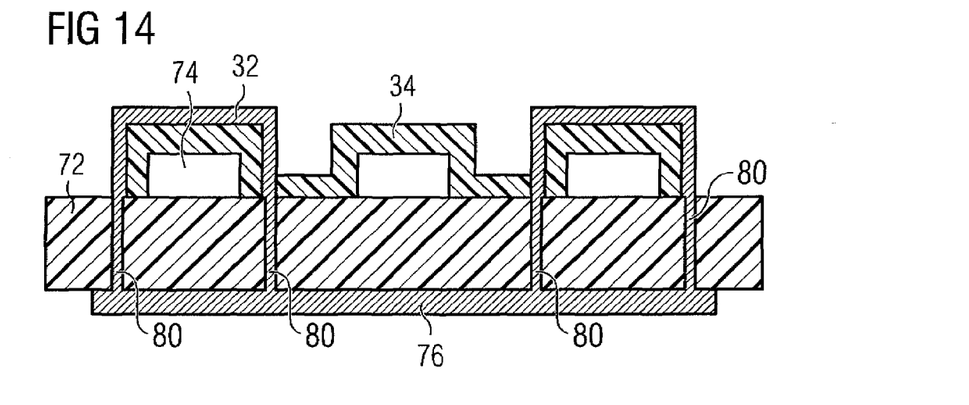
FIG. 14 is a schematic section through one embodiment of a transmission unit, in which individual components of the transmission unit are screened.

FIG. 14 shows a further schematic section through an exemplary embodiment of a transmission unit 24, in which the individual components 74 are screened from each other. Hence, there may be no mutual interference. A dielectric coating 34 is applied to the upper side of the printed circuit board 72, covering all the components of the transmission unit 24. A metal coating 32 is applied to the dielectric coating 34 only in dedicated areas over certain components of the transmission unit 24. Initially, for example, with a laser ablation method or another method (e.g., as was explained in connection with FIG. 4), slot-type contact openings, for example, are introduced at the boundaries of the certain dedicated areas and connected in turn via contact openings to a ground surface 76. This provides that different components 74 or assemblies of the transmission unit 24 such as, for example, the power supply 64, the clock generator 66, the analog/digital converter 68 or the modulator 70 (see FIG. 2) are screened from each other and during operation, do not cause any mutual interference from unwanted emissions of electromagnetic radiation.

The designs and methods described above are exemplary embodiments, and the basic principle may also be varied within a wide range by the person skilled in the art without leaving the scope of the invention as defined in the claims. For example, when using a printed circuit board as the basis of the circuit, the rear of the complete printed circuit board or the metallic coating thereof may be provided with at least one further dielectric coating and at least one further metal coating in order provide a multi-coat screening on the rear. The use of the indefinite article "a" or "an" does not preclude the possibility that the features in question may also be present on a multiple basis. Similarly, the term "unit" does not preclude the possibility that the unit includes a plurality of components that may also be spatially distributed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance local coil comprising:
   a receive antenna for receiving magnetic resonance signals; and
   a transmission unit for transmitting magnetic resonance signal data generated on the basis of the magnetic resonance signals via a data transmission channel to a signal data receiving unit of a magnetic resonance tomography system, the transmission unit comprising a support on which a component is arranged,
   wherein the transmission unit, at least in sections, includes screening with a first metal coating and a first dielectric coating, the first dielectric coating being disposed on the component, the first metal coating being disposed on the first dielectric coating.

2. The magnetic resonance local coil as claimed in claim 1, further comprising an elongated screening enclosure including an enclosed first end face and a second end face lying opposite the enclosed first end face, the second end face lying opposite the enclosed first end face comprising at least one opening for connection to the receive antenna.

3. The magnetic resonance local coil as claimed in claim 2, wherein the elongated screening enclosure is configured such that an interior compartment surrounded by screening forms an attenuating waveguide with a cut-off frequency lying in a prespecified frequency spacing below a transmit frequency for transmitting the magnetic resonance signal data.

4. The magnetic resonance local coil as claimed in claim 3, wherein in the interior compartment of the elongated screening enclosure, connecting lines connect components of the transmission unit and are connected to at least one low-pass filter, a band-stop filter, a high-pass filter, or a combination thereof.

5. The magnetic resonance local coil as claimed in claim 4, wherein the components of the transmission unit are screened from each other by the screening.

6. The magnetic resonance local coil as claimed in claim 1, wherein the screening comprises a second metal coating and a second dielectric coating, and
wherein the second dielectric coating is arranged between the first metal coating and the second metal coating.

7. The magnetic resonance local coil as claimed in claim 6, wherein a thickness of the first metal coating, the second metal coating, or the first metal coating and the second metal coating corresponds to at least a skin depth of electromagnetic waves to be screened.

8. The magnetic resonance local coil as claimed in claim 6, wherein the first metal coating, the second metal coating, or the first metal coating and the second metal coating are provided with structures that have a structure size of from 1 µm to 5000 µm.

9. The magnetic resonance local coil as claimed in claim 6, wherein at least a part of the first metal coating, the second metal coating, or the first metal coating and the second metal coating is configured as a data transmit antenna.

10. The magnetic resonance local coil as claimed in claim 6, wherein the first dielectric coating, the second dielectric coating, or the first dielectric coating and the second dielectric coating are formed from a potting compound or from an insulation film.

11. The magnetic resonance local coil as claimed in claim 10, wherein the first dielectric coating, the second dielectric coating, or the first dielectric coating and the second dielectric coating are formed from the potting compound, and
wherein the potting compound is an epoxy-containing potting compound.

12. The magnetic resonance local coil as claimed in claim 10, wherein the first dielectric coating, the second dielectric coating, or the first dielectric coating and the second dielectric coating are formed from an insulation film, and
wherein the insulation film is a polyimide film with a thickness of from 50 to 500 µm.

13. The magnetic resonance local coil as claimed in claim 6, wherein the first dielectric coating, the second dielectric coating, or the first dielectric coating and the second dielectric coating are provided with structures that have a structure size from 1 to 500 µm.

14. The magnetic resonance local coil as claimed in claim 13, wherein the structures of the first dielectric coating, the second dielectric coating, or the first dielectric coating and the second dielectric coating have a structure size from 1 to 200 µm.

15. The magnetic resonance local coil as claimed in claim 8, wherein the structures of the first metal coating, the second metal coating, the first dielectric coating, the second dielectric coating, or a combination thereof form periodic structures in an elongation direction.

16. The magnetic resonance local coil as claimed in claim 1, wherein the screening is passivated.

17. A magnetic resonance tomography system comprising:
a magnetic resonance local coil comprising:
a receive antenna for receiving magnetic resonance signals; and
a transmission unit for transmitting magnetic resonance signal data generated on the basis of the magnetic resonance signals via a data transmission channel to a signal data receiving unit of a magnetic resonance tomography system, the transmission unit comprising a support on which a component is arranged,
wherein the transmission unit, at least in sections, includes screening with a first metal coating and a first dielectric coating, the first dielectric coating being disposed on the component, the first metal coating being disposed on the first dielectric coating.

18. The magnetic resonance tomography system as claimed in claim 17, further comprising an elongated screening enclosure including an enclosed first end face and a second end face lying opposite the enclosed first end face, the second end face lying opposite the enclosed first end face comprising at least one opening for connection to the receive antenna.

19. The magnetic resonance tomography system as claimed in claim 18, wherein the elongated screening enclosure is configured such that an interior compartment surrounded by screening forms an attenuating waveguide with a cut-off frequency lying in a prespecified frequency spacing below a transmit frequency for transmitting the magnetic resonance signal data.

20. A method for producing a magnetic resonance local coil including a receive antenna for receiving magnetic resonance signals, and a transmission unit for transmitting magnetic resonance signal data generated on the basis of the magnetic resonance signals via a data transmission channel to a signal data receiving unit of a magnetic resonance tomography system, the transmission unit comprising a support on which a component is arranged, the method comprising:
shielding the transmission unit with a screening, the shielding with the screening comprising applying, at least in sections, a dielectric coating on the component, and applying, at least in sections, a metal coating over the dielectric coating.

21. The magnetic resonance local coil as claimed in claim 1, wherein the support is a printed circuit board.

* * * * *